US006391768B1

(12) United States Patent
Lee et al.

(10) Patent No.: US 6,391,768 B1
(45) Date of Patent: May 21, 2002

(54) PROCESS FOR CMP REMOVAL OF EXCESS TRENCH OR VIA FILLER METAL WHICH INHIBITS FORMATION OF CONCAVE REGIONS ON OXIDE SURFACE OF INTEGRATED CIRCUIT STRUCTURE

(75) Inventors: Dawn M. Lee, Lake Oswego, OR (US); Jayanthi Pallinti, Santa Clara, CA (US); Weidan Li, San Jose, CA (US); Ming-Yi Lee, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/703,616

(22) Filed: Oct. 30, 2000

(51) Int. Cl.$^7$ ............................................ H01L 21/4763

(52) U.S. Cl. ...................... 438/633; 438/626; 438/631; 438/634; 438/636

(58) Field of Search .................................. 438/687, 688, 438/622, 623, 624, 625, 626, 627, 628, 629, 631, 633, 636, 634

(56) References Cited

U.S. PATENT DOCUMENTS

| | | | | |
|---|---|---|---|---|
| 3,012,861 A | 12/1961 | Ling | ........................... | 23/223.5 |
| 3,178,392 A | 4/1965 | Kriner | ........................ | 260/46.5 |

(List continued on next page.)

FOREIGN PATENT DOCUMENTS

| | | | | |
|---|---|---|---|---|
| DE | 198 04 375 A1 | 7/1999 | ......... | H01L/21/312 |
| EP | 0 706 216 A2 | 4/1996 | ......... | H01L/23/532 |
| EP | 0 949 663 A2 | 10/1999 | ......... | H01L/21/312 |
| JP | 63003437 | 1/1988 | ........... | H01L/21/90 |
| JP | 2000-267128 | 9/2000 | ........... | G02F/1/136 |
| WO | WO99/41423 | 8/1999 | | |

OTHER PUBLICATIONS

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.
Peters, Laura, "Pursuing the Perfect Low–k Dielectric", *Semiconductor International*, vol. 21, No. 10, Sep., 1998, pp. 64–66, 68, 70, 72, and 74.

(List continued on next page.)

Primary Examiner—Chandra Chaudhari
Assistant Examiner—Thanhha Pham
(74) Attorney, Agent, or Firm—John P. Taylor

(57) ABSTRACT

A process-is disclosed for planarizing an integrated circuit structure by chemical mechanical polishing (CMP) after filling, with at least one metal, a plurality of trenches and/or vias formed in a silicon oxide layer on the integrated circuit structure. The process, which is capable of inhibiting formation of concave surface portions on the silicon oxide surface, during the CMP process, in regions where said trenches and/or vias are closely spaced apart, comprises forming, over a layer of silicon oxide of an integrated circuit structure, an antireflective coating (ARC) layer of dielectric material capable of functioning as a stop layer in a CMP process to remove metal; and using this ARC layer as a stop layer to assist in removal of excess metal used to fill trenches and/or vias formed in the oxide layer. The particular material chosen for the ARC layer should have a lower etch rate, in a CMP process to remove metal, than does the underlying oxide dielectric layer. Trenches and/or vias are formed through the ARC layer and the oxide dielectric layer. These trenches and/or vias are then filled by depositing at least one metal layer over the ARC layer. Excess trench and/or via filler metal is then removed from the top surface of the ARC layer by subjecting the metal to a CMP step which is selective to the ARC layer, thereby permitting the ARC layer to function as a CMP stop layer which protects the underlying oxide dielectric layer from exposure to the CMP process. Since the ARC layer has a lower etch rate, in the CMP process to remove metal, than does the oxide dielectric layer, the formation of dished or concave regions in the surface is inhibited, including those regions where the trenches and/or vias are closely spaced apart.

2 Claims, 2 Drawing Sheets

U.S. PATENT DOCUMENTS

| | | | |
|---|---|---|---|
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,816,900 A | 10/1998 | Nagahara et al. | 451/285 |
| 5,835,226 A | 11/1998 | Berman et al. | 356/382 |
| 5,858,879 A | 1/1999 | Chao et al. | 438/725 |
| 5,863,825 A | 1/1999 | Pasch et al. | 438/401 |
| 5,864,172 A | 1/1999 | Kapoor et al. | 257/634 |
| 5,865,666 A | 2/1999 | Nagahara | 451/10 |
| 5,868,608 A | 2/1999 | Allman et al. | 451/72 |
| 5,874,367 A | 2/1999 | Dobson | 438/787 |
| 5,874,745 A | 2/1999 | Kuo | 257/59 |
| 5,882,251 A | 3/1999 | Berman et al. | 451/527 |
| 5,882,489 A | 3/1999 | Bersin et al. | 204/192.35 |
| 5,888,120 A | 3/1999 | Doran | 451/41 |
| 5,893,756 A | 4/1999 | Berman et al. | 438/692 |
| 5,904,154 A | 5/1999 | Chien et al. | 134/1.2 |
| 5,915,203 A | 6/1999 | Sengupta et al. | 438/669 |
| 5,931,719 A | 8/1999 | Nagahara et al. | 451/41 |
| 5,939,763 A | 8/1999 | Hao et al. | 257/411 |
| 5,941,761 A | 8/1999 | Nagahara et al. | 451/56 |
| 5,944,585 A | 8/1999 | Nagahara et al. | 451/56 |
| 5,957,757 A | 9/1999 | Berman | 451/56 |
| 5,961,375 A | 10/1999 | Nagahara et al. | 451/41 |
| 5,985,679 A | 11/1999 | Berman | 438/7 |
| 5,990,010 A | 11/1999 | Berman | 438/691 |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,066,266 A | 5/2000 | Osugi et al. | 216/85 |
| 6,066,574 A | 5/2000 | You et al. | 438/781 |
| 6,069,085 A | 5/2000 | Berman | 438/697 |
| 6,071,818 A | 6/2000 | Chisholm et al. | 438/692 |
| 6,074,288 A | 6/2000 | Nagahara et al. | 451/384 |
| 6,074,517 A | 6/2000 | Taravade | 156/345 |
| 6,077,783 A | 6/2000 | Allman et al. | 438/691 |
| 6,080,670 A | 6/2000 | Miller et al. | 438/691 |
| 6,114,235 A * | 9/2000 | Foote et al. | 438/636 |
| 6,114,259 A | 9/2000 | Sukharev et al. | 438/789 |
| 6,136,649 A * | 10/2000 | Hui et al. | 438/257 |
| 6,147,012 A | 11/2000 | Sukharev et al. | 438/787 |
| 6,153,524 A | 11/2000 | Henley et al. | 438/691 |
| 6,160,314 A * | 12/2000 | Lee et al. | 257/752 |
| 6,171,951 B1 * | 1/2001 | Lee et al. | 438/640 |
| 6,204,192 B1 | 3/2001 | Zhao et al. | 438/723 |
| 6,228,760 B1 * | 5/2001 | Yu et al. | 438/636 |
| 6,232,658 B1 | 5/2001 | Catabay et al. | 257/701 |
| 6,247,998 B1 | 6/2001 | Wiswesser et al. | |

OTHER PUBLICATIONS

Bothra, S., et al., "Integration of 0.25 μm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Koda, Seiichiro, et al., "A Study of Inhibition Effects for Silane Combustion by Additive Gases", *Combustion and Flame*, vol. 73, No. 2, Aug., 1988, pp. 187–194.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

\* cited by examiner

PROCESS FOR CMP REMOVAL OF EXCESS TRENCH OR VIA FILLER METAL WHICH INHIBITS FORMATION OF CONCAVE REGIONS ON OXIDE SURFACE OF INTEGRATED CIRCUIT STRUCTURE

CROSS REFERENCE TO RELATED APPLICATIONS

The subject matter of this application relates to the subject matter of copending U.S. patent application Ser. No. 09/704,164, filed on Oct. 31, 2000, entitled "PROCESS FOR FORMING LOW K DIELECTRIC MATERIAL BETWEEN METAL LINES", and assigned to the assignee of this application.

The subject matter of this application relates to the subject matter of copending U.S. patent application Ser. No. 09/704,200, filed on Oct. 31, 2000, entitled "PROCESS FOR FORMING INTEGRATED CIRCUIT STRUCTURE WITH LOW DIELECTRIC CONSTANT MATERIAL BETWEEN CLOSELY SPACED APART METAL LINES", and assigned to the assignee of this application.

The subject matter of this application relates to the subject matter of copending U.S. patent application Ser. No. 09/703,145, filed on Oct. 31, 2000, entitled "PROCESS FOR PLANARIZATION OF METAL-FILLED TRENCHES OF INTEGRATED CIRCUIT STRUCTURES", and assigned to the assignee of this application.

The subject matter of this application relates to the subject matter of copending U.S. patent application Ser. No. 09/425,552, filed on Oct. 22, 1999, entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", and assigned to the assignee of this application.

The subject matter of this application relates to the subject matter of copending U.S. patent application Ser. No. 09/605,380, filed on Jun. 27, 2000, entitled "COMPOSITE LOW DIELECTRIC CONSTANT FILM FOR INTEGRATED CIRCUIT STRUCTURE", and assigned to the assignee of this application.

BACKGROUND OF THE INVENTION

1. Field of the Invention

This invention relates to a process for making integrated circuit structures. More particularly, this invention relates to a chemical mechanical polishing (CMP) process for removing excess metal deposited on an oxide layer of an integrated circuit structure during the filling of trenches and/or vias with metal wherein a dielectric etch stop layer is formed over the oxide layer to prevent erosion of the oxide layer during the CMP process.

2. Description of the Related Art

When vias formed in silicon oxide dielectric layers are filled with metal, typically a layer of the metal (or a composite of multiple conductive layers) is deposited on the surface of the oxide dielectric layer. The deposited metal layer fills up the vias as it deposit on the oxide dielectric layer. Similarly, when a trench is filled with metal, in a damascene or double damascene process, a layer of the metal is deposited on the surface of the oxide dielectric layer in which the trench is formed to fill up the trench with metal as the metal deposits on the oxide dielectric layer.

Subsequently the portions of the metal layer on the surface of the oxide dielectric layer are removed by some type of planarizing or polishing process leaving a planarized surface with the metal only in the trenches and/or vias. This idealized situation is shown in prior art FIGS. 1 and 2. In FIG. 1 a silicon oxide dielectric layer 10 is shown formed over underlying portions of an integrated circuit structure 2. Vias, contact openings, and/or trenches 14, previously formed in oxide dielectric layer 10 are, for simplicity sake, shown filled with a single layer of metal 20, e.g., aluminum, which has been deposited over the surface of oxide dielectric layer 10.

As shown in prior art FIG. 2, when the structure of FIG. 1 is subjected to a planarizing step such as a chemical mechanical polishing (CMP) step to remove the excess metal on the surface of the oxide dielectric layer the theoretical result should be the highly planarized structure shown in FIG. 2. All metal is removed from the upper surface of oxide dielectric layer 10, and metal 20 remains only in trenches and/or vias 14, with the upper surface of the metal 20 in trenches and/or vias 14 forming a highly planar surface with the surface of the oxide dielectric layer. The CMP process used is intended to be highly selective to the oxide dielectric material with respect to the metal (i.e., the metal is supposed to be etched and removed by the process at a much faster rate than the oxide dielectric material), thus removing only the excess metal, and leaving the planarized structure shown in FIG. 2.

Unfortunately, this idealized highly planar structure does not always result from use of a CMP process, particularly when the trenches and/or vias are closely spaced apart. Prior art FIGS. 3 and 4 illustrate the problem. In FIG. 3, trenches and/or vias 16 are shown closely spaced apart, in oxide dielectric layer 10. Metal layer 20 is again shown as deposited over oxide dielectric layer 10 to fill trenches and/or vias 14 and 16. However, when the structure of FIG. 3 is subjected to the previously described CMP process to remove the excess surface portions of metal layer 20, some of the oxide dielectric material in between the closely spaced apart metal-filled trenches and/or vias 16 is also removed with the metal. This results in the structure shown in prior art FIG. 4, with eroded oxide portions 18 in between eroded trenches and/or vias 16', with the metal filling 20' in trenches and/or vias 16' also partially eroded away as well, leaving concave surfaces in the regions where the trenches and/or vias are closely spaced apart.

It would be advantageous to be able to planarize the structures of both FIGS. 1 and 3 in a manner which would remove all of the portions of metal layer 20 on the surface of oxide dielectric layer 14, to achieve the highly planarized profile of FIG. 2, even when the trenches and/or vias are closely spaced apart as in FIGS. 3 and 4.

In Weidan Li et al. Ser. No, 09/425,552, entitled INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES, filed on Oct. 22, 1999 and assigned to the assignee of this application, and the subject matter of which is hereby incorporated by references, one of us, with others, suggested the use of a silicon oxynitride capping layer over metal lines to provide an antireflective coating which could also function as a etch stop layer for a CMP planarizing process. However, this process did not protect oxide from a CMP step being used to remove metal, but rather protected metal against a CMP process being used to remove oxide. Neither was the described process for removing oxide over the silicon oxynitride on metal lines intended to solve a problem with respect to formation of concave portions of the metal/oxide surface during the polishing step.

It would, therefore, be desirable to be able to remove all of the excess metal from the surface of an oxide dielectric layer having closely spaced apart metal-filled trenches and/or vias therein while inhibiting the formation of concave portions in the surface of the oxide dielectric layer during a CMP step used to remove the excess metal.

SUMMARY OF THE INVENTION

In accordance with the invention a process is provided for planarizing an integrated circuit structure by chemical mechanical polishing (CMP) after filling, with at least one metal, a plurality of trenches and/or vias formed in a silicon oxide layer on the integrated circuit structure. The process, which is capable of inhibiting formation of concave surface portions on the silicon oxide surface, during the CMP process, in regions where the trenches and/or vias are closely spaced apart, comprises forming, over a layer of silicon oxide of an integrated circuit structure, an antireflective coating (ARC) layer of dielectric material capable of functioning as an etch stop layer in a CMP process to remove metal; and using this ARC layer as an etch stop layer to assist in removal of excess metal used to fill the trenches and/or vias formed in the oxide layer.

The particular material chosen for the ARC layer should have a lower etch rate, in a CMP process, than does the underlying oxide dielectric layer. Trenches and/or vias are then formed through the ARC layer and the oxide dielectric layer. These trenches and/or vias are then filled with conductive material, such as at least one metal layer, by depositing at least one such metal layer over the ARC layer. Excess trench and/or via filler metal is then removed from the top surface of the ARC layer by subjecting the metal to a CMP step which is selective to the ARC layer, thereby permitting the ARC layer to function as a stop layer which protects the underlying oxide dielectric layer from exposure to the CMP process. Since the ARC layer has a lower etch rate, in the CMP process, than does the oxide dielectric layer, the formation of dished and/or concave regions in the surface is inhibited, including those regions where the trenches and/or vias are closely spaced apart.

DETAILED DESCRIPTION OF THE INVENTION

The invention comprises a process for planarizing an integrated circuit structure by chemical mechanical polishing (CMP) after filling, with at least one metal, a plurality of trenches and/or vias formed in a silicon oxide layer on the integrated circuit structure. The process, which is capable of inhibiting formation of concave surface portions on the silicon oxide surface, during the CMP process, in regions where the trenches and/or vias are closely spaced apart, comprises forming, over a layer of silicon oxide of an integrated circuit structure, an antireflective coating (ARC) layer of dielectric material capable of functioning as a stop layer in a CMP process to remove metal; and using this ARC layer as a stop layer to assist in removal of excess metal used to fill trenches and/or vias formed in the oxide layer.

The particular material chosen for the ARC layer should have a lower etch rate, in a CMP process to remove metal, than does the underlying oxide dielectric layer. Trenches and/or vias are formed through the ARC layer and the oxide dielectric layer. These trenches and/or vias are then filled by depositing at least one metal layer over the ARC layer. Excess trench and/or via filler metal is then removed from the top surface of the ARC layer by subjecting the metal to a CMP step which is selective to the ARC layer, thereby permitting the ARC layer to function as a stop layer which protects the underlying oxide dielectric layer from exposure to the CMP process. Since the ARC layer has a lower etch rate, in the CMP process to remove metal, than does the oxide dielectric layer, the formation of dished or concave regions in the surface is inhibited, including those regions where the trenches and/or vias are closely spaced apart.

By use of the term "closely spaced apart" herein, with respect to the spacing apart of filled metal trenches and/or vias from one another, is meant a spacing resulting in a density of at least about 15% trench/via area when the linewidth of the metal line is about 0.25 micrometers ($\mu$m) or less and the via diameter is about 0.25 $\mu$m or less. The process is of further value when the density of such small trench/metal line linewidths and vias diameters is 25% or higher, and is of particular values when the density of such filled trenches and/or vias reaches 50% or higher.

Figure 5:
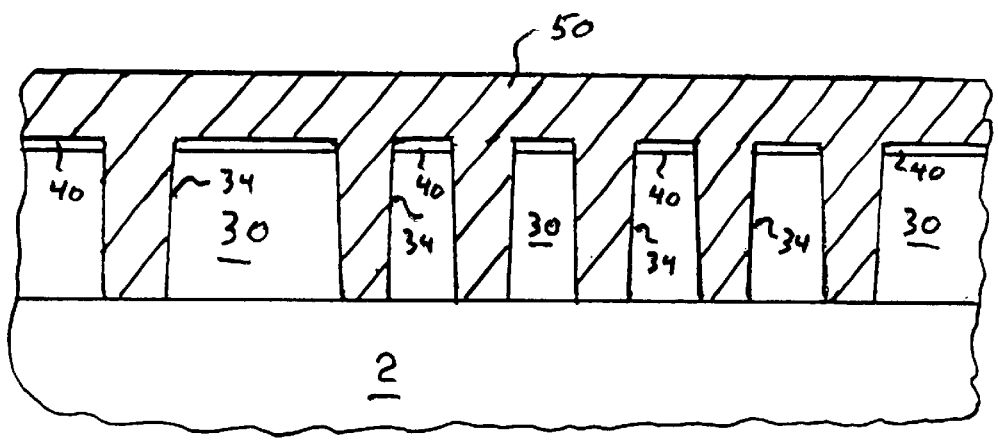
FIG. 5 is a fragmentary vertical cross-sectional view of an integrated circuit structure similar to the structure of FIG. 3, but with an ARC layer formed over the oxide layer, and the metal-filled trenches and/or vias formed through both the ARC layer and the oxide layer.

Turning now to FIG. 5, a silicon oxide dielectric layer 30 is shown formed over integrated circuit structure 2. Silicon oxide layer 30 may comprise any conventional silicon oxide dielectric material formed, for example, by reaction of tetraethylorthosilicate (TEOS) and $O_2/O_3$, or reaction of silane ($SiH_4$) and hydrogen peroxide ($H_2O_2$), provided that oxide layer 30 comprises a material with a higher etch rate than the stop layer to be formed thereon, as will be discussed below.

Alternatively, silicon oxide layer 30 may comprise a low dielectric constant (low k) silicon oxide dielectric where the term "low k" defines a silicon oxide dielectric material having a dielectric constant of 3.5 or less, preferably 3.0 or less. Such a "low k" silicon oxide dielectric material is described in an article by L. Peters, entitled "Pursuing the Perfect Low-K Dielectric", published in Semiconductor International, Volume 21, No. 10, September 1998, at pages 64–74, which describes a low k dielectric material having a dielectric constant of about 3.0 formed using a chemical vapor deposition (CVD) process developed by Trikon Technologies of Newport, Gwent, U.K., which reacts methyl silane ($CH_3$—$SiH_3$) with hydrogen peroxide ($H_2O_2$) to form methyl-doped silicon oxide. Low k silicon oxide dielectric material for oxide layer 30 may also be formed by reacting a mild oxidant such as hydrogen peroxide with the carbon-substituted silane materials disclosed in Aronowitz et al. U.S. Pat. No. 6,303,047, issued Oct. 16, 2001, and assigned to the assignee of this application the, subject matter of which is incorporated by reference.

In accordance with the invention, formed over oxide layer 30 is a thin antireflective coating (ARC) layer 40 having a thickness ranging from about 300 Angstroms (Å) to about 1000 Å, preferably from about 500 Å to about 1000 Å. ARC layer 40, in addition to exhibiting antireflective properties useful for photolithography, comprises a dielectric material having a lower etch rate, in the CMP process to remove metals (such as aluminum, titanium, and tungsten), than silicon oxide, to thereby permit ARC layer 40 to be used as a stop layer which will protect underlying silicon oxide layer 30 from exposure to the CMP process used to remove excess metal used to fill trenches and/or vias 34 in silicon oxide layer 30.

A particular example of a dielectric material which can be used both as an ARC layer and an etch stop layer over silicon oxide layer 30 is a silicon oxynitride which may be formed by reacting silane ($SiH_4$) with nitrous oxide ($N_2O$) and ammonia ($NH_3$) to form a nitrogen-containing silicon oxide material hereinafter referred to as silicon oxynitride by way of illustration and not of limitation, it being understood that the term is not intended to refer to any particular ratio of oxygen to nitrogen.

Other materials which may be used instead of ARC layer 40 to provide protection to the underlying oxide layer during the CMP process would include an oxide layer more stable than oxide layer 30. For example, if oxide layer 30 comprised a high density plasma (HDP) oxide formed by reacting silane with oxygen ($O_2$), then layer. 40 could comprise an oxide layer formed by reacting tetraethylorthosilicate (TEOS) with oxygen ($O_2$) or an $O_2/O_3$ mixture. TEOS-based oxides could also be used as stop layer 40 for at least some low k oxides serving as oxide layer 30. Silicon oxynitride is, however, the preferred material for ARC or stop layer 40, and layer 40 will, hereinafter, be referred to as silicon oxynitride layer 40, by way of illustration, and not of limitation.

After formation of silicon oxynitride layer 40 over silicon oxide layer 30, trenches and/or vias 34 are etched through both silicon oxide layer 30 and silicon oxynitride layer 40, using a photoresist etch mask (not shown), after which trenches and/or vias 34 are then filled with at least one metal such as copper. When copper is used to fill trenches and/or vias 34, a thin (e.g., 100 Å or less) barrier layer of titanium or titanium nitride (not shown) may be deposited first in trenches and/or vias 34 to inhibit migration of copper atoms into the dielectric materials. A layer of copper metal 50 is then blanket deposited over silicon oxynitride layer 40 which will also fill trenches and/or vias 34 as the metal layer deposits. Alternatively, for example, when tungsten metal is used to fill vias 34, a first thin (100 Å or less) layer of titanium may be deposited in vias 34 as an adhesion layer to provide a good bond with the oxide sidewalls of the vias followed by a thin (100 Å or less) barrier layer of titanium nitride prior to deposition of the tungsten main layer to fill the vias.

Regardless of the particular metal or metals used to fill the trenches and/or vias, it is necessary to subsequently remove the excess portions of the metal which form as a layer over the dielectric material, in this case over silicon oxynitride layer 40. For this purpose a chemical mechanical polish (CMP) process is utilized to thereby combine chemical etchant reagents with mechanical abrasion to quickly and accurately remove excess portions of the metal layer or layers on the surface of the silicon oxynitride, leaving only the metal remaining in trenches and/or vias 34. CMP polish/etchant mixtures capable of removing such excess metals are commercially available products. For example, for the removal of copper metal, EPC-5002 CMP slurry is available from the Cabot Microelectronics Corporation which is selective to silicon oxide and highly selective to silicon oxynitride (will preferably etch copper instead of these dielectric materials). A CMP mix capable of removing tungsten, titanium, and titanium nitride while exhibiting selectivity to silicon oxide and high selectivity to silicon oxynitride is W2000 CMP slurry also commercially available from Cabot Microelectronics Corporation.

Figure 6:
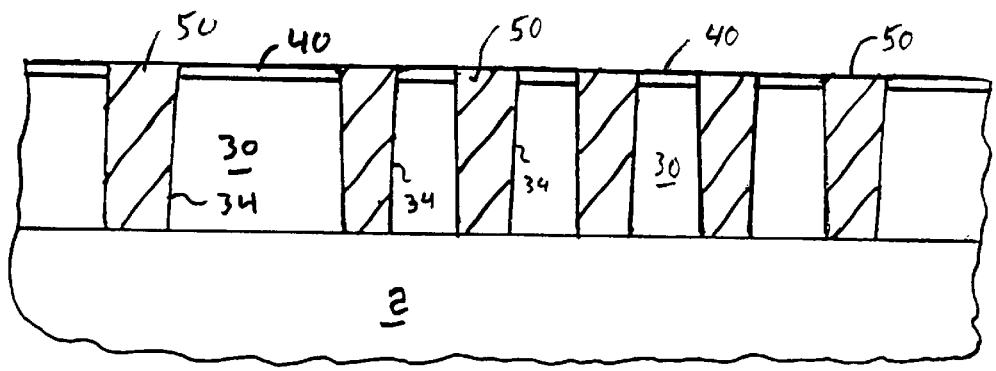
FIG. 6 is a fragmentary vertical cross-sectional view of the structure of FIG. 5 after the structure has been subject to a CMP planarizing step to remove the excess metal from the surface of the ARC layer formed over the oxide layer.

The CMP process is carried out until silicon oxynitride layer 40 is exposed, which may be determined by end point detection or empirically by time and visual inspection. At this time, the CMP process may be terminated, resulting in the structure shown in FIG. 6. Alternatively, the CMP process, upon reaching silicon oxynitride layer 40, may then be carried out for a fixed additional period of time to remove all or most of the silicon oxynitride; or the CMP mixture may be changed, when silicon oxynitride layer 40 is reached, to substitute a CMP system which includes an oxide slurry to remove the silicon oxynitride. A commercially available example of such a CMP oxide slurry is SS-12, available from Cabot Microelectronics Corporation.

Figure 7:
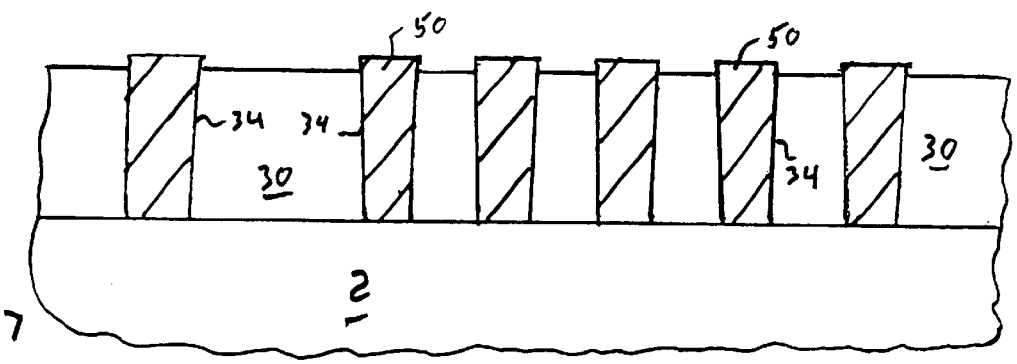
FIG. 7 is a fragmentary vertical cross-sectional view of the structure of FIG. 6 after the optional removal of the ARC layer formed over the oxide layer.

The silicon oxynitride may also be removed by a separate chemical etching step after termination of the CMP process, and rinsing of the wafer in distilled water to remove CMP etch residues. For example, if the nitrogen content of the silicon oxynitride layer does not exceed 2 atomic percent, the silicon oxynitride surface may be treated briefly with a hydrofluoric (HF) acid solution (comprising 1 part concentrated HF acid and 100 parts deionized water) which will etch the silicon oxynitride at a rate of from about 5–10 nanometers (nm) per minute, after which the wafer would be washed in distilled water to remove etch residues. If the nitrogen content of the silicon oxynitride exceeds 2 atomic percent, hot phosphoric acid can be used to remove the thin silicon oxynitride layer. Such selective removal of the silicon oxynitride layer, by any of the methods discussed, will result in the structure shown in FIG. 7. It should be noted that the protruding portions of metal layer 50 remaining in trenches and/or vias 34 after removal of silicon oxynitride layer 40, as shown in FIG. 7, are exaggerated for illustrative purposes only. The actual height of metal 50 in trenches and/or vias 34 above the top surface of silicon oxide layer 30 (after removal of protective silicon oxynitride layer 40) is less than 500 A, and usually less than 100 Å.

Alternatively, if desired, the silicon oxynitride layer on the top surface of the silicon oxide layer may be retained thereon since the silicon oxynitride layer is also capable of functioning as a dielectric layer similar to the silicon oxide layer.

Figure 1:
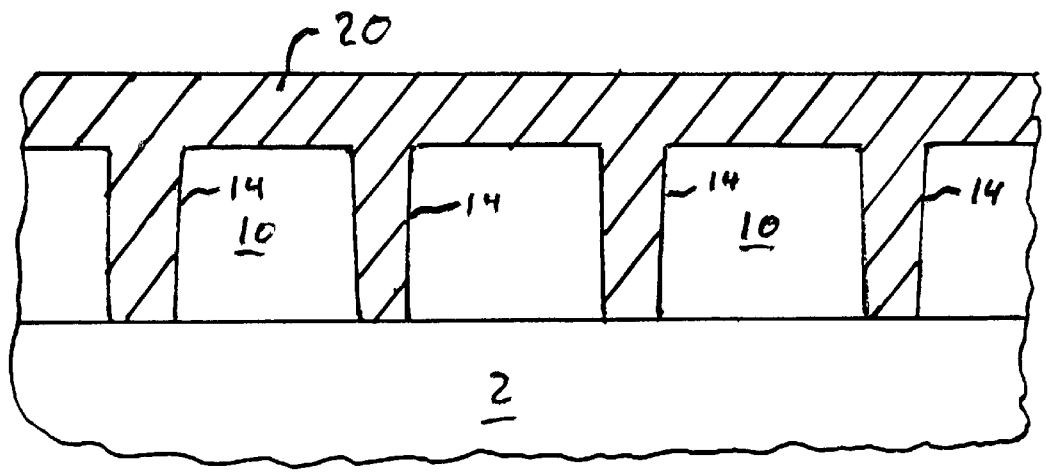
FIG. 1 is a fragmentary vertical cross-sectional view of a prior art integrated circuit structure showing a layer of metal formed over an oxide layer with spaced apart trenches and/or vias therein, wherein the metal fills each of the trenches and/or vias.
Figure 2:
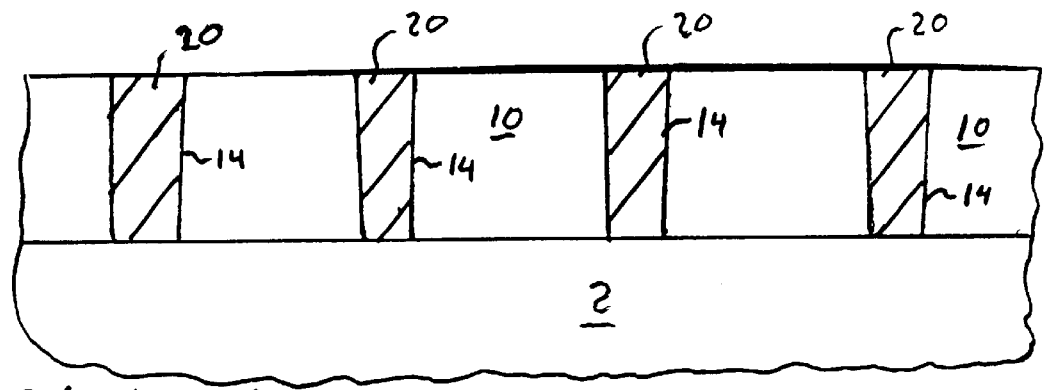
FIG. 2 is a fragmentary vertical cross-sectional view of the prior art integrated circuit structure of FIG. 1 after the FIG. 1 structure has been subjected to a CMP process to remove the excess metal from the surface of the oxide layer, leaving a planarized surface of the oxide layer and the metal-filled trenches and/or vias.
Figure 3:
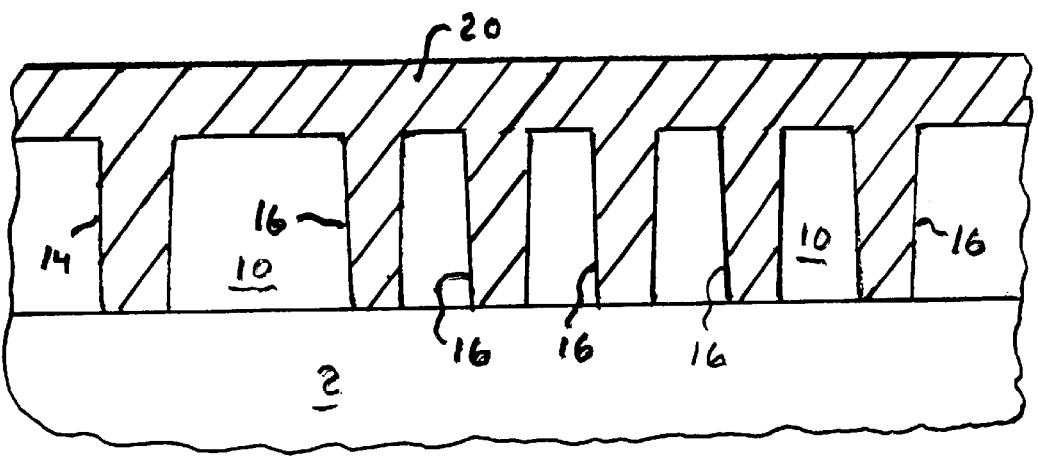
FIG. 3 is a fragmentary vertical cross-sectional view of a modification of the prior art integrated circuit structure of FIG. 1, showing metal filled trenches and/or vias which are more closely spacer apart than in the FIG. 1 structure.
Figure 4:
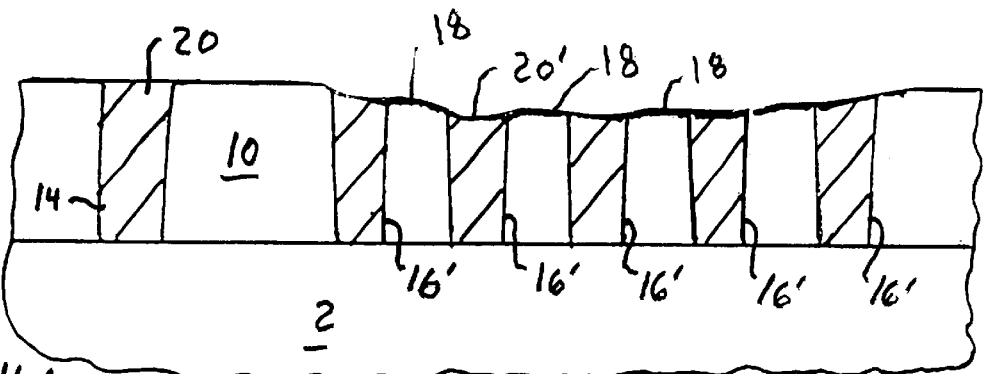
FIG. 4 is a fragmentary vertical cross-sectional view of the prior art integrated circuit structure of FIG. 3 after the FIG. 3 structure has been subjected to a CMP process to remove the excess metal from the surface of the oxide layer, leaving a surface with concave portions where the metal-filled trenches and/or vias are closely spaced apart.

In any case, because of the lower etch rate of the protective portions or caps of silicon oxynitride layer 40 in the CMP process, in comparison to the underlying silicon oxide layer 30, even closely spaced apart trenches and/or vias filled with metal may be planarized with significant reduction of the prior art oxide erosion and resulting concave structure previously shown in prior art FIG. 4.

Having thus described the invention what is claimed is:

1. A process for planarizing an integrated circuit structure by chemical mechanical polishing (CMP) after filling, with at least one metal, a plurality of trenches and/or vias formed in a low k silicon oxide layer on the integrated circuit structure, said process capable of inhibiting formation of concave surface portions on the low k silicon oxide surface, during the CMP process, in regions where said trenches and/or vias are spaced apart which comprises:

a) forming on an integrated circuit structure a layer of low k silicon oxide dielectric material formed by reacting a mild oxidant comprising hydrogen peroxide with a carbon-substituted silane selected from the group consisting of:

i) a methyl-substituted silane; and ii) a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group and z is 2y+1 for a branched alkyl group and 2y−1 for a cyclic alkyl group;

b) forming over said low k silicon oxide layer from about 300 Å to about 1000 Å of an antireflective coating (ARC) layer of a silicon oxynitride dielectric material having a lower etch rate in said CMP process than said low k silicon oxide and therefore capable of functioning as an etch stop layer;

c) forming a plurality of trenches and/or vias through said ARC layer and said low k silicon oxide layer beneath said ARC layer;

d) depositing over said ARC layer and over the surfaces of said plurality of trenches and/or vias a barrier layer selected from the group consisting of titanium and titanium nitride;

e) depositing over said barrier layer a layer to fill said plurality of trenches and/or vias;

f) performing a chemical mechanical polishing (CMP) step on said copper layer and said barrier layer to remove those portions of said copper layer and said barrier layer not in said plurality of trenches and/or vias, using said ARC layer as an CMP stop layer; and g) removing said ARC layer of dielectric material, after removal of said copper layer and said barrier layer over said ARC layer, using a chemical etchant selected from the group consisting of phosphoric acid and hydrofluoric acid;

whereby said ARC layer of dielectric material protects said low k silicon oxide layer from exposure to said CMP process to thereby inhibit erosion of said low k silicon oxide layer during said CMP step.

2. A process for planarizing an integrated circuit structure by chemical mechanical polishing (CMP) after filling, with at least one metal, a plurality of trenches and/or. vias formed in a low k silicon oxide layer on the integrated circuit structure, said process capable of inhibiting formation of concave surface portions on the low k silicon oxide surface, during the CMP process, in regions where said trenches and/or vias are spaced apart which comprises, a) forming on an integrated circuit structure a layer of low k; silicon oxide dielectric material formed by reacting a mild oxidant comprising hydrogen peroxide with a carbon-substituted silane selected from the group consisting of:

i) a methyl-substituted silane; and ii) a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group and z is 2y+1 for a branched alkyl group and 2y−1 for a cyclic alkyl group;

b) forming over said low k silicon oxide layer from about 300 Å to about 1000 Å of an antireflective coating (ARC) layer of a silicon oxynitride dielectric material having a lower etch rate in said CMP process than said low k silicon oxide and therefore capable of functioning as,an etch stop layer;

c) forming a plurality of trenches and/or vias through said ARC layer and said low k silicon oxide layer beneath said ARC layer;

d) depositing over said ARC layer and over the surfaces of said plurality of trenches and/or vias an adhesion layer of titanium;

e) depositing over said ARC layer barrier layer of titanium nitride;

f) depositing over said barrier layer a tungsten layer to fill said plurality of trenches and/or vias;

g) performing a chemical mechanical polishing (CMP) step on said tungsten layer, said barrier layer, and said adhesion layer to remove those portions of said tungsten layer, said barrier layer, and said adhesion layer not in said plurality of trenches and/or vias, using said ARC layer as an CMP stop layer; and h) removing said ARC layer of dielectric material, after removal of said tungsten layer, said barrier layer, and said adhesion layer over said ARC layer, using a chemical etchant selected from the group consisting of phosphoric acid and hydrofluoric acid;

whereby said ARC layer of dielectric material protects said low k silicon oxide layer front exposure to said CMP process to thereby inhibit erosion of said low k silicon oxide layer during said CMP step.

* * * * *